United States Patent
Akamine et al.

(12)

(10) Patent No.: US 6,765,268 B2
(45) Date of Patent: Jul. 20, 2004

(54) MULTIPLE TRANSISTORS HAVING A COMMON GATE PAD BETWEEN FIRST GROUP OF DRAINS AND SECOND GROUP OF DRAINS

(75) Inventors: Hitoshi Akamine, Maebashi (JP); Masashi Suzuki, Takasaki (JP); Masao Yamane, Takasaki (JP); Tetsuaki Adachi, Toubu (JP)

(73) Assignee: Renesas Technology Corp, Tokyo (JP)

( * ) Notice: Subject to any disclaimer, the term of this patent is extended or adjusted under 35 U.S.C. 154(b) by 0 days.

(21) Appl. No.: 10/291,834

(22) Filed: Nov. 12, 2002

(65) Prior Publication Data

US 2003/0102494 A1 Jun. 5, 2003

(30) Foreign Application Priority Data

Nov. 30, 2001 (JP) ........................................ 2001-366351

(51) Int. Cl.⁷ ............................................... H01L 29/76
(52) U.S. Cl. ....................... 257/368; 257/386; 257/734; 257/401
(58) Field of Search ................................ 257/368, 386, 257/401, 734, 225–230, 290–294

(56) References Cited

U.S. PATENT DOCUMENTS 5,880,494 A * 3/1999 Watanabe et al.
6,590,440 B1 * 7/2003 Williams et al.

* cited by examiner

*Primary Examiner*—Fetsum Abraham
(74) *Attorney, Agent, or Firm*—Miles & Stockbridge P.C.

(57) ABSTRACT

The present invention provides a semiconductor device comprising a semiconductor substrate, and transistors formed on the semiconductor substrate, wherein control electrode terminals constituting external electrode terminals of the transistors, and first electrode terminals which transmit output signals, are provided on a main surface of the semiconductor substrate, wherein the control electrode terminals are provided at least one, and a plurality of the first electrode terminals are arranged on one side and a plurality of the first electrode terminals are arranged on the other side with the control electrode terminals being interposed therebetween, wherein a portion including the control electrode terminals and a plurality of the first electrode terminals located on one side of the control electrode terminals constitute a first transistor portion, and wherein a portion including the control electrode terminals and a plurality of the first electrode terminals located on the other side of the control electrode terminals constitute a second transistor portion. The semiconductor device is quadrangular.

8 Claims, 14 Drawing Sheets

MULTIPLE TRANSISTORS HAVING A COMMON GATE PAD BETWEEN FIRST GROUP OF DRAINS AND SECOND GROUP OF DRAINS

BACKGROUND OF THE INVENTION

The present invention relates to a semiconductor device, a high-frequency power amplifying device (high-frequency power amplifying module) and a wireless communication apparatus with the high-frequency power amplifying device built therein. The present invention relates to, for example, a technology effective for application to a cellular telephone of a multiband communication system, which has a plurality of communication functions different in communication frequency band.

An AMPS (Advanced Mobile phone Service) of an analog system, which has heretofore been used and covers the North America all over the land, and a so-called dual mode cellular telephone wherein digital systems such as TDMA (time division multiple access), CDMA (code division multiple access), etc. are built in one cellular phone, have recently been used in a North American cellular market.

On the other hand, a GSM (Global System for Mobile Communication) system and a DCS (Digital Cellular System) system both using a TDMA technology and an FDD (frequency division duplex) technology have been used in Europe and the like.

"Nikkei Electronics" issued by Nikkei Business Publications, Inc., the July 26 issue in 1999 [no.748], P140 to P153 has described a dual mode cellular phone wherein a GSM whose use frequency ranges from 800 MHz to 900 MHz, and a PCN (another name for DSC) whose use frequency ranges from 1.7 GHz to 1.8 GHz, are integrated into one. The same reference has described a multi-layered ceramics-device in which passive parts are brought into integration to downsize the whole circuit.

A dualband-oriented RF power module has been described in "GAIN", No. 131, 2000.1 issued by the Semiconductor Group of Hitachi, Ltd.

SUMMARY OF THE INVENTION

With advanced information communications, a cellular phone has also been more multi-functioned. Therefore, a high-frequency power amplifying device (high-frequency power amplifying module) built in the cellular phone has also been multi-functioned following it. In a high-frequency power amplifying device having a plurality of communication modes (including a communication band) in particular, the number of assembly parts increases as compared with a single communication mode product, and the device increases in size so that the product cost rises.

Therefore, the present inventors have discussed a size reduction in semiconductor chip in which field effect transistors (MOSFET: Metal Oxide Semiconductor Field-Effect Transistor) have been built therein, in order to bring the high-frequency power amplifying device into less size.

FIGS. 16 through 20 are respectively diagrams related to a high-frequency power amplifying device (high-frequency power amplifying module) 20 discussed in advance of the present invention, and a semiconductor chip in which transistors constituting each final amplifying stage have been built. FIG. 19 is an equivalent circuit diagram of the high-frequency power amplifying device, and FIG. 20 is a typical plan view showing a layout of electronic parts on a wiring board (module substrate) 21B in the high-frequency power amplifying device 20, respectively.

The high-frequency power amplifying device is a dual-band type high-frequency power amplifying module. As illustrated in the circuit diagram of FIG. 19, the high-frequency power amplifying device has an amplification system P for a PCN (Personal Communications Network) system as a first amplification system, and an amplification system G for a GSM system as a second amplification system. Thus, FIGS. 19 and 20 are shown inclusive of P as in the case of CP1 (condenser) and RP1 (resistor) in the PCN amplification system P, which are of symbols indicative of a capacitance (condenser) and a resistance constituting a rectifying circuit or the like, and G as in the case of CG1 (condenser) and RG1 (resistor) in the GSM amplification system G.

As shown in FIGS. 19 and 20, external electrode terminals of the amplification system P correspond to an input terminal Pin1, an output terminal Pout1 and a source potential Vdd1, whereas external electrode terminals in the amplification system G correspond to an input terminal Pin2, an output terminal Pout2 and a source potential Vdd2. A reference potential (Ground: GND) and a control terminal Vapc are shared. A selection as to whether either the GSM amplification system G or the PCN amplification system P should be operated, is performed under a changeover of a switch SW1. The switch SW1 is changed over according to a signal supplied to a select terminal Vct1. The control terminal Vapc is connected to the switch SW1. A bias signal supplied to the control terminal Vapc serves so as to supply a bias potential to respective transistors of the GSM amplification system G according to the changeover of the switch SW1. Slender square portions in the circuit diagram shown in FIG. 19 show microstrip lines respectively.

The PCN amplification system P and the GSM amplification system G are both provided in a three-stage configuration [first amplifying stage, second amplifying stage and third amplifying stage (final amplifying stage)] wherein transistors are sequentially cascade-connected. Further, the final amplifying stage takes a power combination configuration wherein two transistors are connected in parallel to increase an output. The transistors make use of MOSFETs (Metal Oxide Semiconductor Field-Effect-Transistors).

Thus, the PCN amplification system P takes a configuration wherein a transistor Q1, a transistor Q2 and parallel-connected transistors Q3 and Q4 are sequentially cascade-connected between the input terminal Pin1 and the output terminal Pout1 as the first amplifying stage, second amplifying stage and final amplifying stage respectively, and constitutes a rectifying circuit on the input side, a rectifying circuit on the output side, and a circuit such as a noise filter or the like. Therefore, condensers (CP1 through CP13), bypass condensers (CB1 and CB2), resistors (RP1 through RP4), and an inductor L1 are disposed in respective locations as discrete parts.

Gate electrodes used as control electrode terminals of the transistors Q1 through Q4 are respectively supplied with a signal to be amplified and a bias potential. The bias potential is a signal supplied to the control terminal Vapc as described above. This signal is supplied to the PCN amplification P or the GSM amplification G by being selected by the switch SW1. The switch SW1 is changed over based on the signal supplied to the select terminal Vct1 to thereby perform such a selection. The potentials supplied to the respective gate electrodes are respectively defined according to predetermined bias resistors.

First electrode terminals (drain electrodes) of the transistors Q1 through Q4 are supplied with the source potential Vdd1. An amplified signal is outputted to the first electrode terminal of each transistor. Second electrode terminals (source electrodes) of the respective transistors are respectively supplied with the reference potential (GND).

The GSM amplification system G takes a configuration wherein a transistor Q5, a transistor Q6 and parallel-connected transistors Q7 and Q8 are sequentially cascade-connected between the input terminal Pin2 and the output terminal Pout2 as the first amplifying stage, second amplifying stage and final amplifying stage respectively, and constitutes a rectifying circuit on the input side, a rectifying circuit on the output side, and a circuit such as a noise filter or the like. Therefore, condensers (CG1 through CG13), bypass condensers (CB3 and CB4), resistors (RG1 through RG4), and an inductor L2 are disposed in respective locations as discrete parts.

Gate electrodes used as control electrode terminals of the transistors Q5 through Q8 are respectively supplied with a signal to be amplified and a bias potential. First electrode terminals (drain electrodes) of the transistors Q5 through Q8 are supplied with the source potential Vdd2. An amplified signal is outputted to the first electrode terminal of each transistor. Second electrode terminals (source electrodes) of the respective transistors are respectively supplied with the reference potential (GND).

The transistors Q1, Q2, Q5 and Q6 are monolithically formed in a chip 1. The transistors Q3 and Q4, which constitute the final amplifying stage of the amplification system P, are monolithically formed in a chip 2. The transistors Q6 and Q8, which constitute the final amplifying stage of the amplification system G, are monolithically formed in a chip 3.

The electrodes of the respective chips and wire bonding pads 21D of wirings 21W provided on a main surface of the wiring board 21 are electrically connected to one another by conductive wires 14. Electrodes provided on the lower surfaces of the respective chips are respectively electrically connected to conductive fixed portions continuously connected to wirings when they are fixed to the wiring board 21. Thus, the circuit shown in FIG. 19 is configured. Although not described in particular, passive parts, which constitute condensers, resistors and inductors, etc., result in surface-mountable chip parts. The respective electrodes are electrically connected to their corresponding electrode connecting portions continuously connected to their corresponding wirings, by means of solder.

Meanwhile, the semiconductor device (semiconductor chip) 10 having built therein the transistors constituting the final amplifying stages, has such an electrode layout configuration as shown in FIGS. 16 and 18. FIG. 16 is a typical plan view of the semiconductor device (semiconductor chip) 10 having incorporated therein the transistors constituting the final amplifying stages, FIG. 17 is an equivalent circuit diagram of the semiconductor device, and FIG. 18 is a typical plan view showing electrode patterns for the transistors, respectively. The semiconductor chip 10 constitutes each of the chips 2 and 3 shown in FIGS. 19 and 20. The semiconductor chip 10 shows an example of the chip 3 and will be explained using FIG. 18.

The semiconductor chip 10 is shaped in the form of a rectangle. In the semiconductor chip 10, gate electrode pads 11 are arranged along one long side of the rectangle, drain electrode pads 12 are arranged along the other long side thereof, and a source electrode pad 13 is provided at an intermediate portion of the one long side. In the drawing, the gate electrode pads 11 and the drain electrode pads 12 are respectively arranged eight in a row and divided into two four by four. A resistor R5 is connected between the gate electrode pads 11 divided into the two, and a resistor R6 is connected between the drain electrode pads 12 divided into the two. In the case of the chip 2, the drain electrode pads are arranged six in a row and divided into two three by three.

As shown in FIG. 16, a portion including a source electrode pad 13, and gate electrode pads 11 and drain electrode pads 12 provided on the left side of resistors R5 and R6 constitutes a first transistor portion (FET1), whereas a portion including the source electrode pad 13, and gate electrode pads 11 and drain electrode pads 12 provided on the right side of the resistors R5 and R6 constitutes a second transistor portion (FET2). The FET1 and FET2 constitute the transistors Q3 and Q4 in the chip 2 shown in FIGS. 19 and 20, and constitute transistors Q7 and Q8 in the chip 3 shown in FIGS. 19 and 20.

As shown in FIG. 18, the electrode patterns are brought to a finger pattern structure wherein fingers of respective electrodes engage with one another in a comb-teeth form. Such an electrode pattern configuration results in such a structure as to shorten the fingers in order to avoid a delay in signal's phase. Thus, as a result of adoption of such a structure as to shorten the fingers while the gate electrode pads and the drain electrode pads are being provided face to face with one another, the semiconductor chip 10 results in a slender structure as shown in FIG. 16. For instance, the size of the semiconductor chip 10 becomes 2 mm long and 1 mm wide.

However, when the semiconductor chip 10 becomes slender in this way, the size of the wiring board on which the semiconductor chip 10 is mounted, also increases and hence the high-frequency power amplifying device is also upsized.

An object of the present invention is to provide a semiconductor device with amplifiers built therein, in which a difference in length-to-width dimension is small.

Another object of the present invention is to provide a downsizable high-frequency power amplifying device.

A further object of the present invention is to provide a wireless communication apparatus capable of being reduced in size.

The above, other objects and novel features of the present invention will become apparent from the description of the present specification and the accompanying drawings.

Summaries of typical ones of the inventions disclosed in the present application will be explained in brief as follows:

(1) There is provided a semiconductor device, comprising:
  a semiconductor substrate; and
  transistors formed on the semiconductor substrate,
  wherein control electrode terminals constituting external electrode terminals of the transistors, and first electrode terminals which transmit output signals, are provided on a main surface of the semiconductor substrate,
  wherein the one or more control electrode terminals are provided, and a plurality of the first electrode terminals are arranged on one side and a plurality of the first electrode terminals are arranged on the other side with the control electrode terminals being interposed therebetween,
  wherein a portion including the control electrode terminals and a plurality of the first electrode terminals located on one side of the control electrode terminals constitute a first transistor portion, and wherein a portion including the control electrode terminals and a plurality of the first electrode terminals located on the other side of the control electrode terminals constitute a second transistor portion.

The semiconductor device can be rendered close to a square. The first electrode terminals are respectively arranged in a row along a pair of faced sides of the semiconductor substrate, and the control electrode terminals are placed in between both the rows. Each of the semiconductor regions formed on the semiconductor substrate respectively electrically connected to the control electrode terminals and the first electrode terminals and second electrode terminals for the transistors takes a finger structure. The length of each finger becomes less than or equal to 300 μm. The transistors are respectively field effect transistors formed on a silicon substrate. Gate electrode terminals thereof serve as the control electrode terminals, drain electrode terminals thereof serve as the first electrode terminals, and source electrode terminals thereof serve as the second electrode terminals, respectively.

Such a semiconductor device is incorporated as each final amplifying stage of a high-frequency power amplifying device having the following configuration. The high-frequency power amplifying device comprises one or more amplification systems formed on a wiring board, each of which comprising, an input terminal supplied with a signal to be amplified;
an output terminal;
a control terminal which receives a power control signal therein;
a plurality of amplifying stages sequentially cascade-connected between the input terminal and the output terminal; and
a first power terminal and a second power terminal which respectively supply predetermined potentials to the amplifying stages,
wherein each of the amplifying stages includes control electrode terminals which receive an input signal and the power control signal supplied thereto, first electrode terminals each of which transmits an output signal of the amplifying stage, and second electrode terminals each connected to the second power terminal.

The transistors are provided on the semiconductor substrate in plural form.

The semiconductor device is square and the first electrode terminals are respectively arranged in rows along a pair of faced sides of the semiconductor substrate. Further, the control electrode terminals are located in between both the rows.

Respective semiconductor regions formed on the semiconductor substrate, which are respectively electrically connected to the control electrode terminals and the first electrode terminals and second electrode terminals for the transistors provided in the semiconductor device, serve as a finger structure. Further, the length of each finger of the finger structure is set to less than or equal to 300 μm so as to avoid an increase in signal phase shift.

The first electrode terminals and the control electrode terminals for the transistors of the semiconductor device constitute wire bonding pads to which conductive wires are connectable. Second electrode terminals serving as external electrode terminals are provided on the back surface of the semiconductor substrate. The control electrode terminals serve as a long-extending strip electrode, and one end of the wire is connected to one desired spot of the strip electrode.

The first electrode terminals, control electrode terminals and second electrode terminals constituting the external electrode terminals of the transistors are provided on a main surface of the semiconductor substrate constituting the semiconductor device. Further, these respective electrode terminals serve as protruded electrodes. They are connected to their corresponding wirings on the wiring board via the protruded electrodes.

The first electrode terminals of the first transistor portion employed in the semiconductor device, and the first electrode terminals of the second transistor portion employed therein are respectively electrically connected to one another via a resistor provided on the semiconductor substrate constituting the semiconductor device.

The transistors are respectively field effect transistors formed on a silicon substrate, and gate electrode terminals thereof serve as the control electrode terminals, drain electrode terminals thereof serve as the first electrode terminals, and source electrode terminals thereof serve as the second electrode terminals, respectively.

A first-stage amplifying stage and a second-stage amplifying stage in each the amplification systems are monolithically formed on a single semiconductor chip.

In the high-frequency power amplifying device in which the amplification systems are provided at least two, the respective transistors constituting the respective final amplifying stages in the respective amplification systems are built in a single semiconductor substrate. Wires for connecting the control electrode terminals of the respective transistors and the wirings on the wiring board and wires for connecting the first electrode terminals of the respective transistors and the wirings on the wiring board respectively extend in a direction to intersect one another between the adjacent transistors and between the adjacent wires.

An angle at which both the wires intersect is 30° or more.

The semiconductor device is square.

A wireless communication apparatus has the high-frequency power amplifying device referred to above.

The high-frequency power amplifying device is built in a wireless communication apparatus.

According to the means of the above (1), (a) There is provided a structure wherein a plurality of drain electrode pads are disposed along one of the sides of a semiconductor chip with gate electrode pads being interposed therebetween, and a plurality of drain electrode pads are disposed along the other thereof of the semiconductor chip. Therefore, the semiconductor chip can be rendered close to a square. As a result, when the semiconductor chip is built in a high-frequency power amplifying device, a wiring board of the high-frequency power amplifying device can be reduced as compared with the case in which a slender semiconductor chip is incorporated therein, and the high-frequency power amplifying device can be made small-sized. Owing to the size reduction in the high-frequency power amplifying device, a wireless communication apparatus with the high-frequency power amplifying device built therein can be also reduced in size.

(b) Since electrode patterns for transistors are configured as a finger pattern structure, and the length of each finger is set to less than or equal to 300 μm, a phase shift in signal does not increase.

DETAILED DESCRIPTION OF THE PREFERRED EMBODIMENTS

Figure 1:
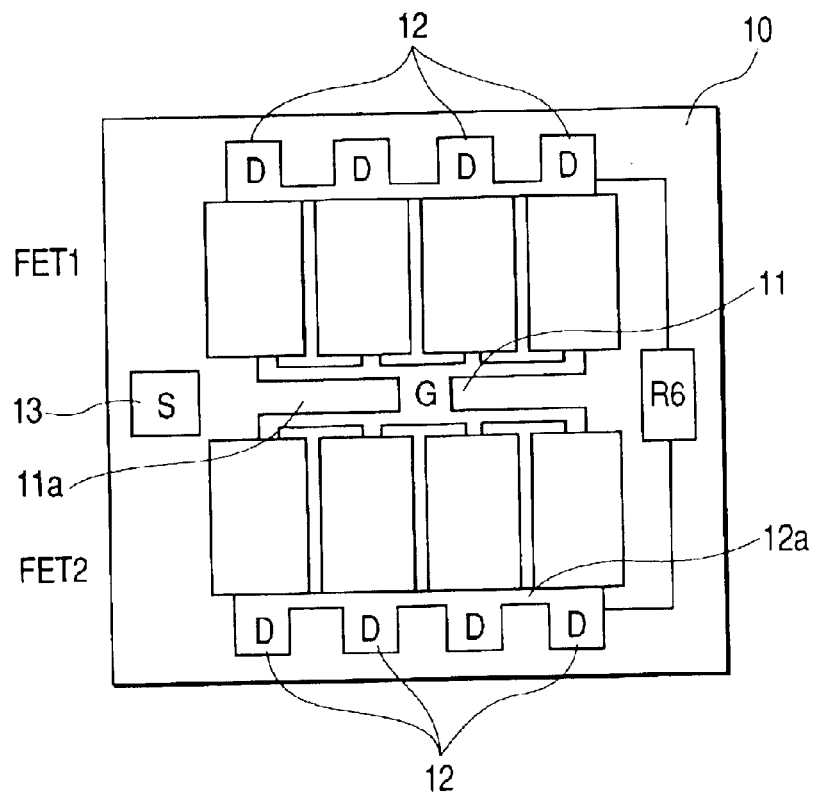
FIG. 1 is a typical plan view of a semiconductor device with FETs built therein, showing one embodiment (first embodiment) of the present invention.

Preferred embodiments of the present invention will hereinafter be described in detail with reference to the accompanying drawings. Incidentally, components each having the same function in all drawings for describing the embodiments of the present invention are respectively identified by the same reference numerals and their repetitive description will be omitted.

(First Embodiment)

In a first embodiment, a description will be made of an example in which the present invention is applied to a semiconductor device (semiconductor chip) which constitutes final amplifying stages of a high-frequency power amplifying device having a GSM amplification system and a PCN amplification system. A dual-band type wireless communication apparatus with the high-frequency power amplifying device built therein will also be described.

Figure 5:
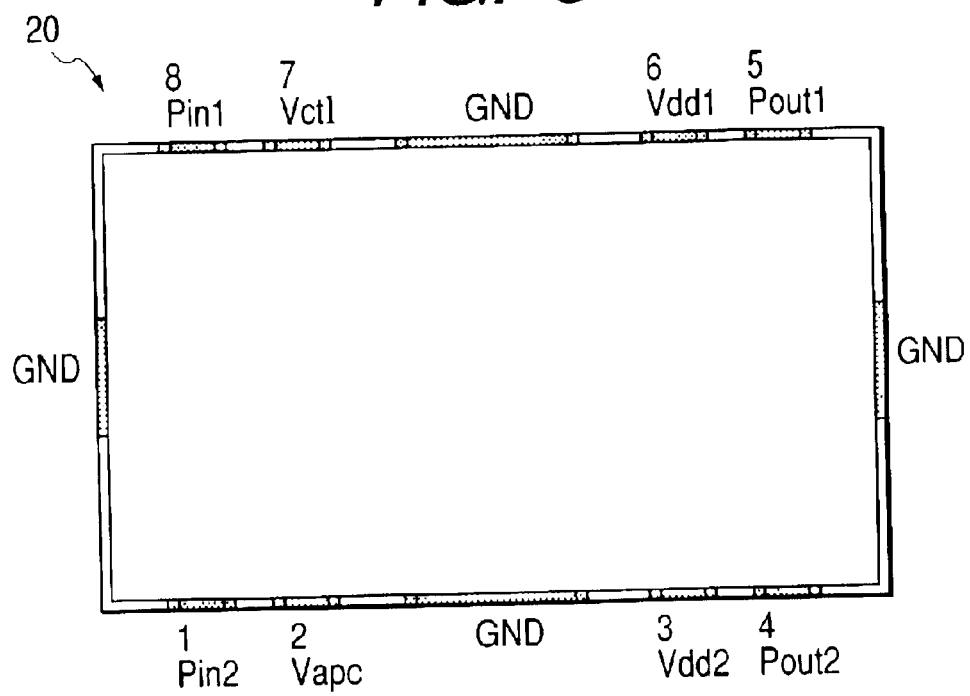
FIG. 5 is a plan view of a high-frequency power amplifying device according to the first embodiment.
Figure 6:
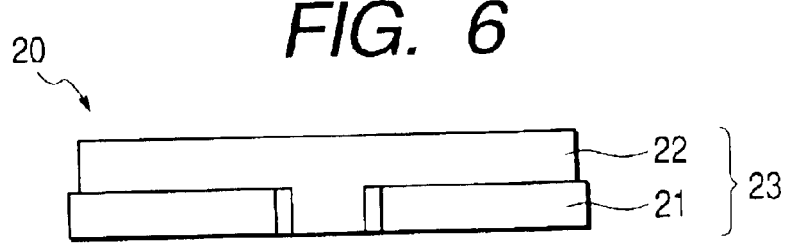
FIG. 6 is a side view of the high-frequency power amplifying device according to the first embodiment.
Figure 7:
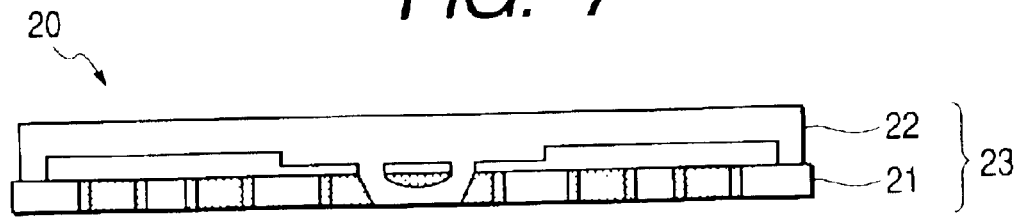
FIG. 7 is a front view of the high-frequency power amplifying device according to the first embodiment.
Figure 8:
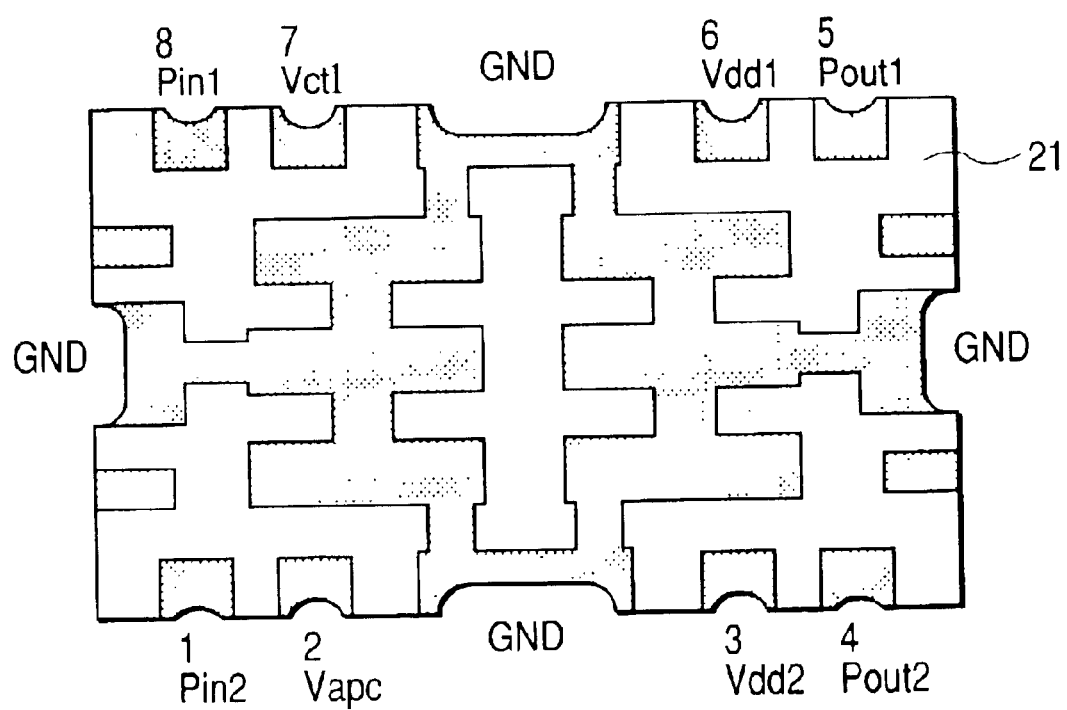
FIG. 8 is a typical plan view showing in a see-through form, electrode patterns at the bottom of the high-frequency power amplifying device according to the first embodiment.

A high-frequency power amplifying device (high-frequency power amplifying module) 20 is shaped in the form of a flat rectangle-body structure in appearance as shown in a plan view of FIG. 5, a side view of FIG. 6 and a front view of FIG. 7. Electrode patterns at the bottom of the high-frequency power amplifying device are represented as such patterns as shown in a typical plan view of FIG. 8 illustrated in a see-through form. Areas given dots correspond to electrode portions respectively.

The high-frequency power amplifying device 20 has a structure wherein a package 23 having a fat rectangle-body structure is made up of a plate-shaped wiring board (module substrate) 21 and a cap 22 attached to one surface side (main surface side) of the wiring board 21 so as to overlap. The cap 22 is made of metal which assumes the role of an electromagnetic shield effect. As shown in FIG. 10, such a circuit as shown in FIG. 9 is made up of wiring patterns of the wiring board 21 and electronic components or parts including semiconductor elements or chips mounted on the wiring board 21.

As shown in FIGS. 7 and 8, external electrode terminals are respectively provided from the peripheral surface of the wiring board 21 to its bottom. Each of the external electrode terminals serves as a surface-mount type and is formed by wirings formed on the module substrate 21 and solder formed on the surface of the wiring.

Reference numerals 1 to 8 of the external electrode terminals are as follows: The terminal 1 corresponds to an input terminal Pin2 of a GSM amplification system G, the terminal 2 corresponds to a control terminal Vapc, the terminal 3 corresponds to a source or power supply potential Vdd2, the terminal 4 corresponds to an output terminal Pout2 of the amplification system G, the terminal 5 corresponds to an output terminal Pout1 of a PCN amplification system P, the terminal 6 corresponds to a source potential Vdd1 of the amplification system P, the terminal 7 corresponds to a select terminal Vct1, and the terminal 8 corresponds to an input terminal Pin1 of the amplification P, respectively. Although not marked with reference numeral, GND indicates a ground terminal for supplying a reference potential.

Figure 9:
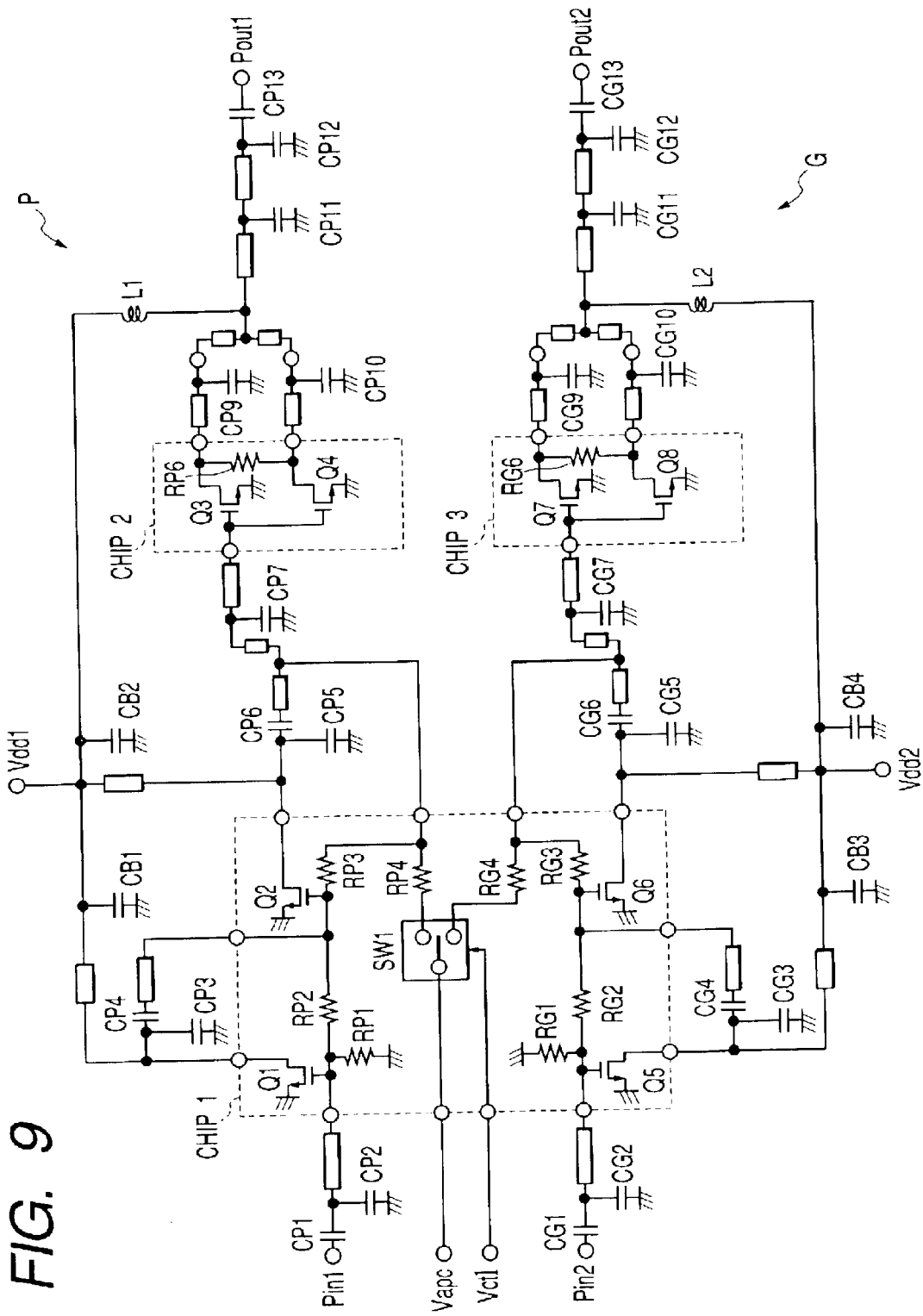
FIG. 9 is an equivalent circuit diagram of the high-frequency power amplifying device according to the first embodiment.
Figure 10:
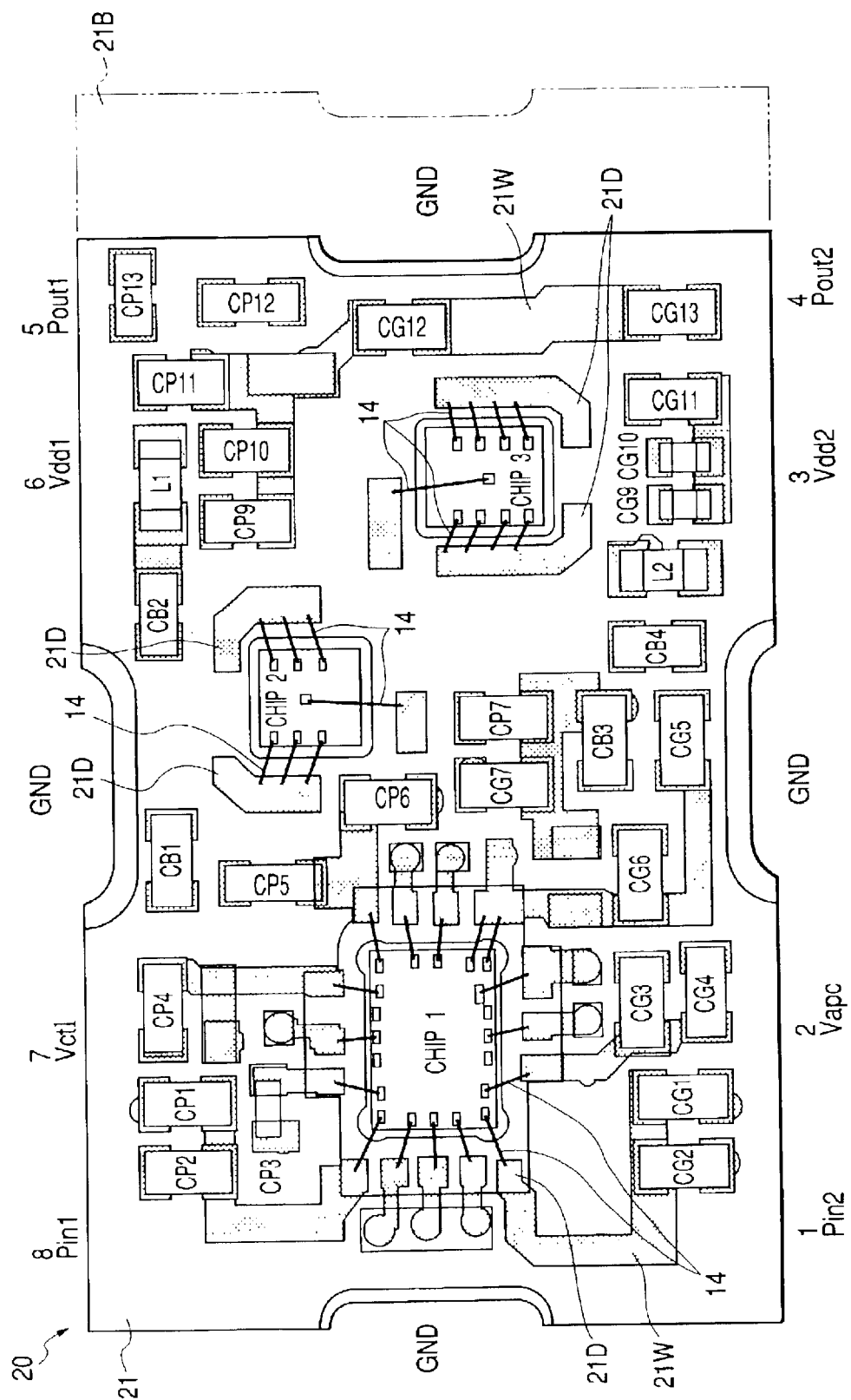
FIG. 10 is a plan view showing an outline of a layout of electronic components on the surface of a wiring board employed in the high-frequency power amplifying device.

As shown in FIGS. 9 and 10, the high-frequency power amplifying device 20 is of a dual-band type high-frequency power amplifying module having a PCN amplification system P and a GSM amplification system G. The amplification system P and the amplification system G are substantially identical in circuit configuration although they are different in performance of their electronic parts used therein.

As illustrated in a circuit diagram shown in FIG. 9, an amplification system P for a PCN system is provided as a first amplification system, and an amplification system G for a GSM system is provided as a second amplification system. Thus, FIGS. 9 and 10 are shown inclusive of P as in the case of CP1 (condenser) and RP1 (resistor) in the PCN amplification system P, which are of symbols indicative of a capacitive element (condenser) and a resistive element constituting a rectifying circuit or the like, and G as in the case of CG1 (capacitor) and RG1 (resistor) in the GSM amplification system G.

As shown in FIGS. 9 and 10, external electrode terminals of the amplification system P correspond to an input terminal Pin1, an output terminal Pout1 and a source potential Vdd1, whereas external electrode terminals in the amplification system G correspond to an input terminal Pin2, an output terminal Pout2 and a source potential Vdd2. A reference potential (ground: GND) and a control terminal Vapc are shared.

A selection as to whether either the GSM amplification system G or the PCN amplification system P should be operated, is performed under a changeover of a switch SW1. The switch SW1 is changed over according to a signal supplied to a select terminal Vct1. The control terminal Vapc is connected to the switch SW1. A bias signal supplied to the control terminal Vapc serves so as to supply a bias potential to respective transistors of the GSM amplification system G or supply a bias potential to respective transistors of the PCN amplification system P according to the changeover of the switch SW1. The bias potential is determined according to each bias resistor or the like. Slender square portions in the circuit diagram shown in FIG. 9 show microstrip lines respectively.

The PCN amplification system P and the GSM amplification system G are both provided in a three-stage configuration [first amplifying stage, second amplifying stage and third amplifying stage (final amplifying stage)] wherein transistors are sequentially cascade-connected. Further, the final amplifying stage takes a power combination configuration wherein two transistors are connected in parallel to increase an output. The transistors make use of MOSFETs.

Thus, the PCN amplification system P takes a configuration wherein a transistor Q1, a transistor Q2 and parallel-connected transistors Q3 and Q4 are sequentially cascade-connected between the input terminal Pin1 and the output terminal Pout1 as the first amplifying stage, second amplifying stage and final amplifying stage respectively, and constitutes a rectifying circuit on the input side, a rectifying circuit on the output side, and a circuit such as a noise filter or the like. Therefore, condensers (CP1 through CP13), bypass condensers (CB1 and CB2), resistors (RP1 through RP4), and an inductor L1 are disposed in respective locations as discrete parts.

Similarly, the GSM amplification system G takes a configuration wherein a transistor Q5, a transistor Q6 and parallel-connected transistors Q7 and Q8 are sequentially cascade-connected between the input terminal Pin2 and the output terminal Pout2 as the first amplifying stage, second amplifying stage and final amplifying stage respectively, and constitutes a rectifying circuit on the input side, a rectifying circuit on the output side, and a circuit such as a noise filter or the like. Therefore, condensers (CG1 through CG13), bypass condensers (CB3 and CB4), resistors (RG1 through RG4), and an inductor L2 are disposed in respective locations as discrete parts.

A chip 1 is monolithically formed with the transistors Q1, Q2, Q5 and Q6 which constitute the first and second amplifying stages of the amplification systems P and G. A chip 2 is monolithically formed with the transistors Q3 and Q4 which constitute the final amplifying stage of the amplification system P. The transistors Q6 and Q8, which constitute the final amplifying stage of the amplification system G, are monolithically formed in a chip 3.

As shown in FIG. 10, electrodes of the individual chips and wire bonding pads 21D of wirings 21W provided on a main surface of a wiring board 21 are respectively electrically connected to one another by conductive wires 14. Further, electrodes-provided on lower surfaces of the respective chips are electrically connected to their corresponding conductive fixed portions provided in connection with their corresponding fixed wirings when they are fixed to the wiring board 21. Thus, such a circuit as shown in FIG. 9 is constituted. Although not described in particular, passive parts constituting condensers, resistors and inductors or the like serve as chip parts capable of being surface-mounted. Respective electrodes are electrically connected to their corresponding electrode connecting portions which connect with their corresponding wirings by solder.

Gate electrodes used as control electrode terminals of the transistors Q1 through Q8 are respectively supplied with a signal to be amplified and a bias potential. The bias potential is a signal supplied to the control terminal Vapc as described above. This signal is selected by changeover of the switch SW1 based on the signal supplied to the select terminal Vct1. On one occasion, the transistors Q1 through Q4 of the amplification system P are controlled, whereas on another occasion, the transistors Q5 through Q8 of the amplification system G are controlled.

First electrode terminals (drain electrodes) of the transistors Q1 through Q4 in the amplification system P are supplied with the source potential Vdd1, whereas first electrode terminals (drain electrodes) of the transistors Q5 through Q8 in the amplification system G are supplied with the source potential Vdd2. An amplified signal is outputted to the first electrode terminal of each transistor. Second electrode terminals (source electrodes) of the respective transistors are respectively supplied with the reference potential (GND).

Figure 17:
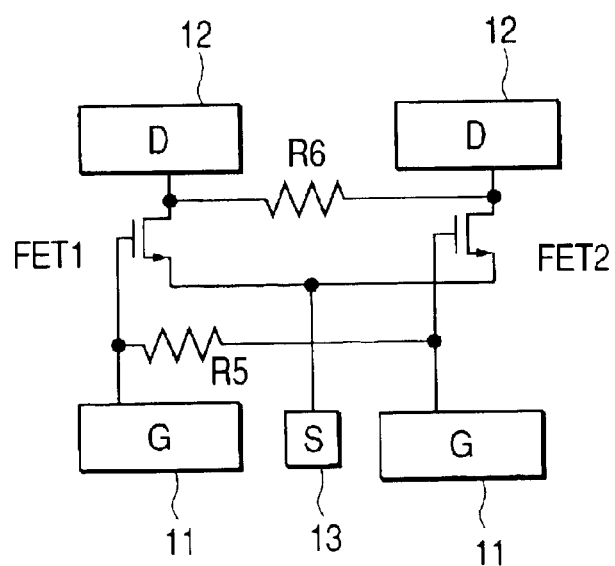
FIG. 17 is an equivalent circuit diagram of the semiconductor device shown in FIG. 16.
Figure 18:
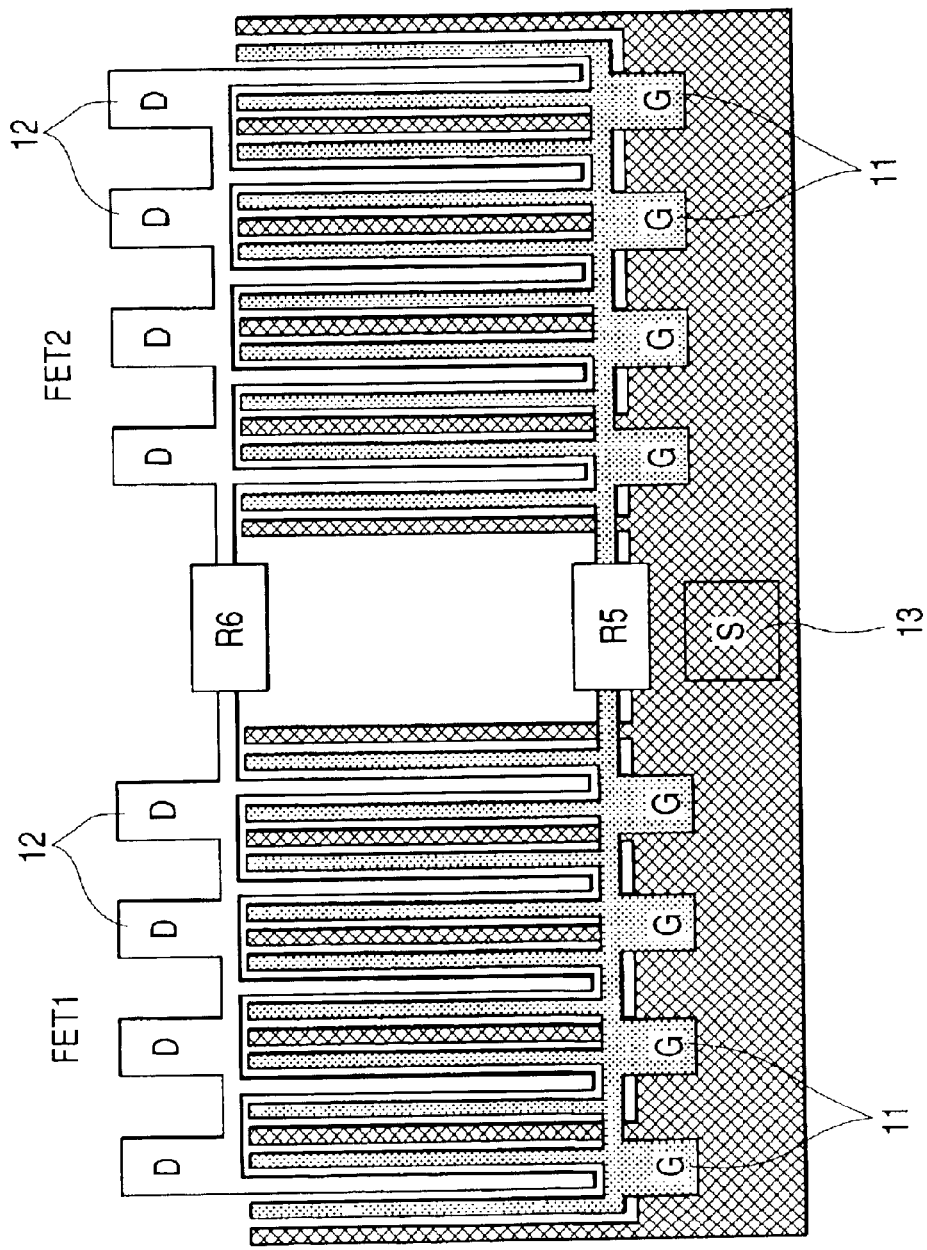
FIG. 18 is a typical plan view showing electrode patterns of the transistors shown in FIG. 16.
Figure 19:
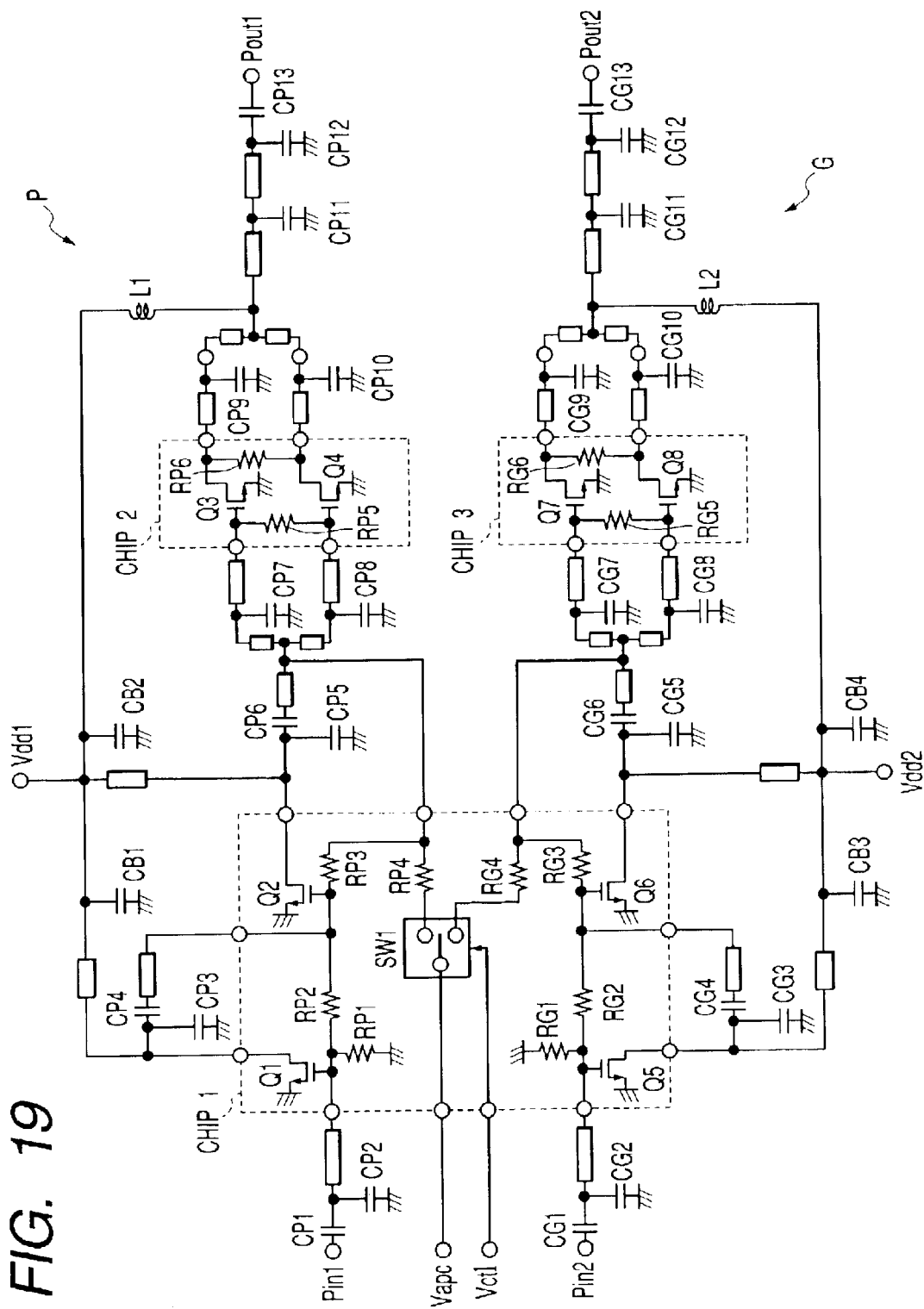
FIG. 19 is an equivalent circuit diagram of the high-frequency power amplifying device discussed in advance of the present invention.

On the other hand, let's look at the input rectifying circuit comprising the transistors Q3 and Q4 in the amplification system P. In the case of such a circuit shown in FIG. 19, the capacitive element CP7 whose one end is connected or tied to GND, is connected to the gate electrode of the transistor Q3, the capacitive element CP8 whose one end is connected to GND, is connected to the gate electrode of the transistor Q4, and the resistor R5 (see FIG. 17) is connected between the gate electrodes of both transistors Q3 and Q4. Since, however, the gate electrodes of the transistors Q3 and Q4 are rendered common in the case of the first embodiment, the capacitive element CP8 and the resistor R5 are eliminated (see FIG. 2).

Figure 2:
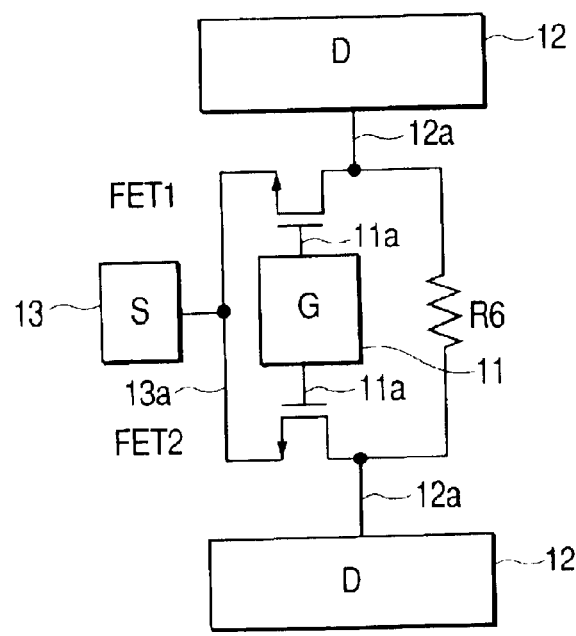
FIG. 2 is an equivalent circuit diagram of the semiconductor device.

The elimination of the capacitor and resistor is made similarly even to the amplification system G. As a result, the capacitive element CG8 shown in FIG. 19, and the resistor R5 shown in FIG. 17 can be also eliminated as shown in FIGS. 9 and 2. Accordingly, the removal of the capacitive elements CP8 and CG8 from the high-frequency power amplifying device 20 allows even a reduction in the size of the high-frequency power amplifying device 20.

Figure 20:
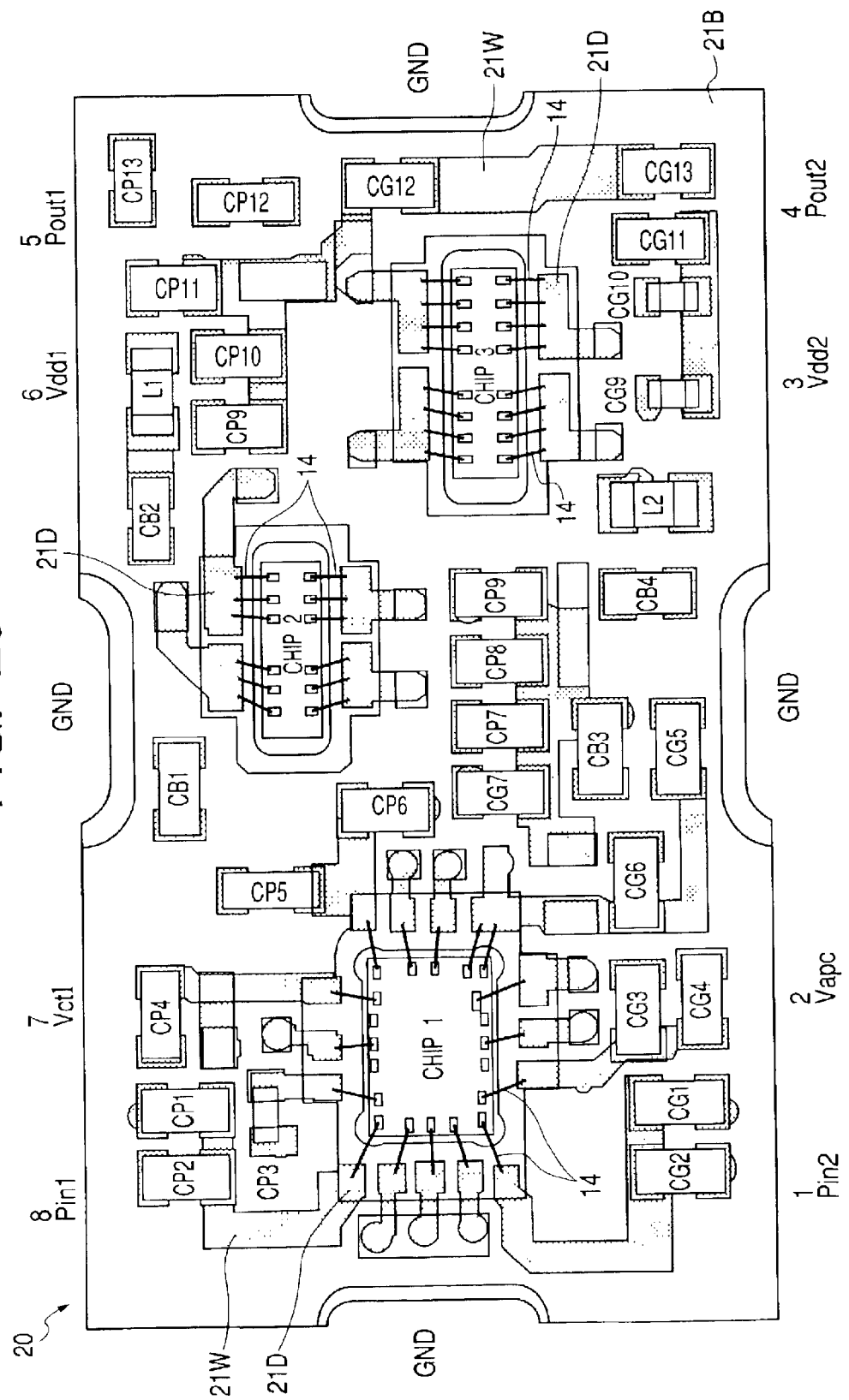
FIG. 20 is a typical plan view showing a layout of electronic parts on a wiring board in the high-frequency power amplifying device discussed in advance of the present invention.

Although this will be described below in detail, it is possible to bring the semiconductor chip 10 formed with the transistors constituting each final amplifying stage into less size, i.e., reduce the mounting area of the semiconductor chip owing to squaring of the semiconductor chip, and thereby achieve a size reduction in the high-frequency power amplifying device 20. It is understood from FIG. 10 that when the wiring board 21 according to the first embodiment and the wiring board 21B shown in FIG. 20 are superimposed on each other so that their left ends coincide with each other, the right end of the wiring board 21B shown in FIG. 20 extends out as indicated by a chain double-dashed line, whereby the wiring board 21 according to the first embodiment is brought into less size. Since a cap is slightly smaller than the wiring board in outer dimension and superimposed on the wiring board, the reduction in the size of the wiring board results in a size reduction in the high-frequency power amplifying device. This size reduction results from the size reduction in the semiconductor chip 10 according to the first embodiment and the removal of the capacitive elements CP8 and CG8.

Since the first-stage amplifying stages and second-stage amplifying stages of the amplification system P and amplification system G are formed monolithically on the single semiconductor chip (chip 1), the high-frequency power amplifying device 20 can be rendered small-sized.

Figure 3:
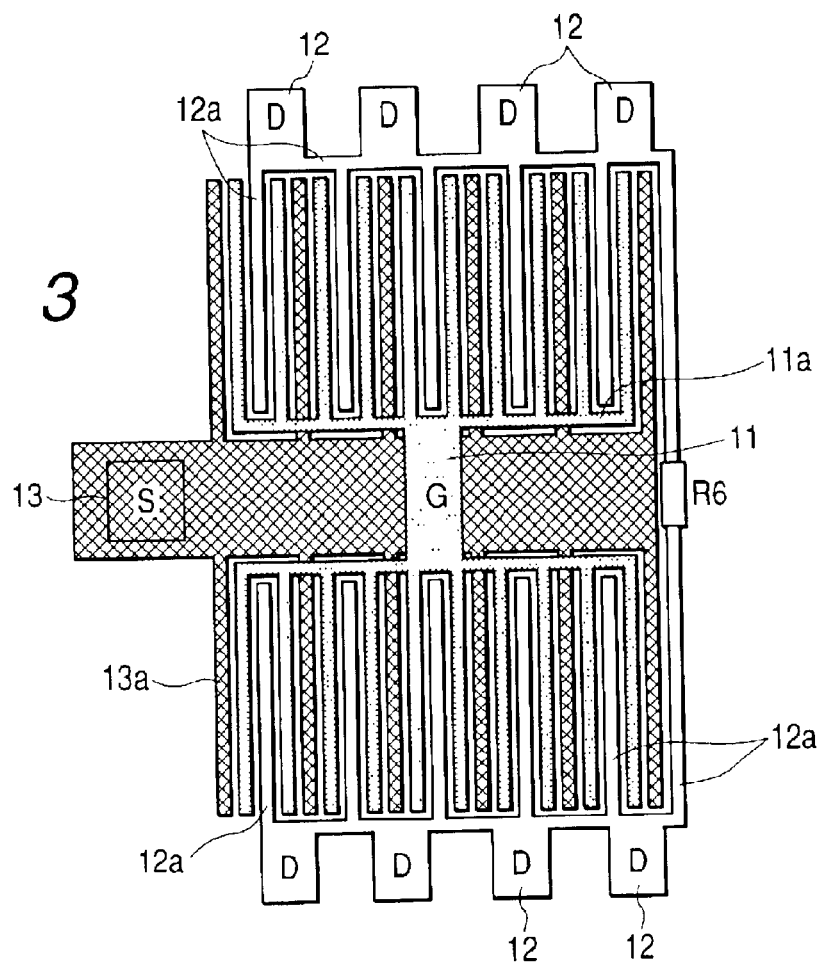
FIG. 3 is a typical diagram showing electrode patterns of the semiconductor device.
Figure 4:
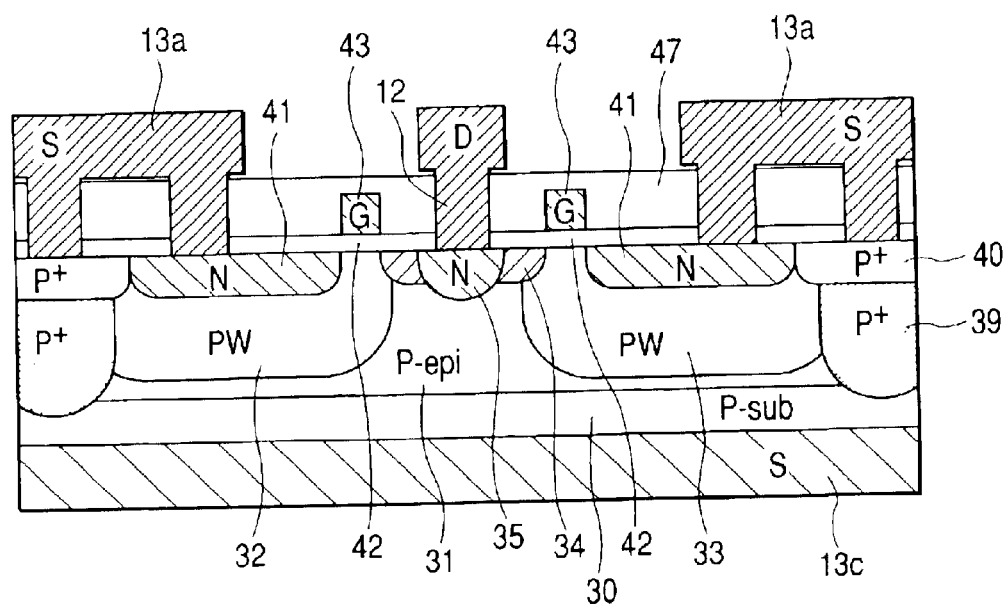
FIG. 4 is a cross-sectional view of a single finger portion of each FET employed in the semiconductor device.

The semiconductor device (semiconductor chip) 10 monolithically formed with the two transistors constituting the final amplifying stage will next be explained with reference to FIGS. 1 through 4. FIG. 1 is a typical plan view of a semiconductor device with FETs built therein, showing one embodiment (first embodiment) of the present invention, FIG. 2 is an equivalent circuit diagram of the semiconductor device, FIG. 3 is a typical diagram showing electrode patterns of the semiconductor device, and FIG. 4 is a cross-sectional view of a single finger portion or section of each FET, respectively.

The semiconductor device (semiconductor chip) 10 according to the first embodiment has a structure wherein field effect transistors (FETs) and the like are monolithically formed on a silicon substrate. Each FET is configured so as to have a gate electrode terminal (control electrode terminal), a drain electrode terminal (first electrode terminal), and a source electrode terminal (second electrode terminal). The semiconductor chip 10 has a shape close to or near a square as shown in FIG. 1. For instance, the semiconductor chip 10 has a shape near a square whose one side is 1.2 mm and whose another side is 1.0 mm.

As shown in FIG. 1, a gate electrode pad 11 is provided in the center of a main surface of the semiconductor chip 10. The gate electrode pad 11 has such a width and a length as to enable a connection of a wire. In the case of a wire having a diameter of about 25 $\mu$m, for example, a square whose one side is 80 $\mu$m, is required as a wire bonding pad.

Drain electrode pads 12 are arranged side by side by one row with the gate electrode pad 11 interposed therebetween. Namely, the drain electrode pads 12 are arranged in a row on one side of the gate electrode pad 11, whereas the drain electrode pads 12 are arranged in a row on the other side of the gate electrode pad 11.

The drain electrode pads 12 in the respective rows are placed side by side along one pair of corresponding sides (corresponding to the upper and lower sides in FIG. 1) of the semiconductor chip 10. In the drawing, the drain electrode pads 12 are respectively disposed four side by side. In FIG. 1, a source electrode pad 13 is provided at a leftward central portion. The source electrode pad 13 and the drain electrode pads 12 are areas to which wires can be connected, respectively as described above.

The respective electrode pads are formed at parts of respective electrode layers. Namely, the gate electrode pad 11 is formed at part of a gate electrode layer 11a, the drain electrode pads 12 are formed at parts of a drain electrode layer 12a, and the source electrode pad 13 is formed at part of a source electrode layer 13a. While it is needless to say that the respective electrode layers have patterns respectively formed in predetermined patterns, for example, an insulative protection film for covering the surfaces of the respective electrode layers is removed at predetermined spots to thereby expose the electrode layers, whereby the exposed electrode layers are formed as their corresponding pads.

On the other hand, while four rectangles are respectively shown between the gate electrode pad 11 and arrays of the drain electrode pads 12 in the typical diagram shown in FIG. 1, this portion is shaped in the form of a comb teeth-shaped electrode pattern structure (finger pattern structure). As shown in FIG. 3, the finger pattern structure is shaped in the form of a comb teeth-shaped electrode pattern in which the gate electrode layer 11a, drain electrode layers 12a and the source electrode layer 13a are provided so that the gate electrode layer 11a is located between the drain electrode layer 12a and the source electrode layer 13a. Such a single finger is repeatedly disposed along the column direction of each drain electrode pads 12 to form a multifinger. The multifingers are respectively provided on one side and the other side of the gate electrode pad 11. The length of the single finger is less than or equal to 300 $\mu$m and the single finger is provided so as not to cause a phase shift in signal (not to increase).

An area portion including the gate electrode pad 11, the source electrode pad 13 and a plurality of the drain electrode pads 12 provided on one side form a first field effect transistor portion (FET1), whereas an area portion including the gate electrode pad 11, the source electrode pad 13 and a plurality of the drain electrode pads 12 provided on the other side form a second field effect transistor portion (FET2). As shown in FIG. 9, the FET1 constitutes the transistor Q3 and the FET2 constitutes the transistor Q4 in the amplification system P. In the amplification system G, the FET1 constitutes the transistor Q7, and the FET2 constitutes the transistor Q8. However, the chip 2 having the transistors Q3 and Q4 in the amplification system P takes such a structure that the drain electrode pads 12 are respectively provided three side by side as shown in FIG. 10.

The drain electrode pads 12 of the FET1 and the drain electrode pads 12 of the FET2 are connected to one another by a resistor 6. The resistor 6 is provided to match outputs of the respective FETs with each other. A source electrode is provided on the back surface of the semiconductor chip 10.

FIG. 4 is a cross-sectional view of the semiconductor chip 10 and is a diagram showing a single finger portion or section. An epitaxial layer 31 made up of a P type having a high resistance is provided on a main surface of a semiconductor substrate 30 comprising P-type silicon having a low resistance. P-type P well regions 32 and 33 are provided at surface layer portions of the epitaxial layer 31 with a predetermined interval being left therebetween. This layer serves as a punchthrough stopper layer.

A surface layer portion of the epitaxial layer 31 located between the pair of P well regions 32 and 33 serves as an N-type drain offset region 34. An N-type drain region 35 is provided at an intermediate N-type drain offset region 34 portion lying between the pair of P well regions 32 and 33. The bottom of the drain region 35 penetrates the N-type drain offset region 34 and extends up to a depth lying in the course of the epitaxial layer 31.

On the other hand, P$^+$-type regions 39, which reach depths lying in the course of the semiconductor substrate 30, are provided outside the pair of P well regions 32 and 33 so as to surround the P well regions 32 and 33 and the like. Further, P$^+$-type P type contact regions 40 whose surfaces are exposed, are provided on the P$^+$-type regions 39 respectively. N-type source regions 41 are respectively provided at surface layer portions of the pair of P well regions 32 and 33 with being spaced predetermined intervals from the ends of the N-type drain offset region 34.

A well region portion lying between the N-type drain offset region 34 and each source region 41 serves as a channel layer. Each of gate electrodes 43 is formed on the channel layer with a gate insulating film (oxide film) 42 interposed therebetween. The whole main surface of the epitaxial layer 31 is covered with an interlayer insulating film 47. The interlayer insulating film 47 covers even the gate electrodes 43.

The interlayer insulating film 47 is partly provided with holes for contact. Electrode layers are selectively formed on the interlayer insulating film 47. The electrode layers are charged even into the contact holes and electrically connected to semiconductor regions (layers) located at their bottoms. The electrode layer connected to the drain region 35 results in a drain electrode layer 12a, the electrode layer connected to the source region 41 and the P-type contact region 40 serves as a source electrode layer 13a, and an electrode layer connected to each gate electrode 43 although not shown in the drawing serves as a gate electrode layer 11a. Although not shown in the drawing, the interlayer insulating film 47 and electrode layers exposed from the interlayer insulating film 47 are covered with an insulative protection film (passivation film), and a predetermined protection film is removed, so that a gate electrode pads 11, drain electrode pads 12, and a source electrode pad 13 are respectively formed. A source electrode 13c is formed on the back surface of the semiconductor substrate 30.

The semiconductor chip 10 according to the first embodiment has such a structure that the drain electrode pads 12 are disposed in plural form along one side of the semiconductor chip 10 with the gate electrode pad 11 interposed therebetween, and the drain electrode pads 12 are disposed in plural form along the other side of the semiconductor chip 10. Therefore, an aspect ratio of the semiconductor chip 10 can be rendered close to 1, and the semiconductor chip 10 can be made close to the square as in the first embodiment. Therefore, fixed portions extending over a long distance as in the case of a slender semiconductor chip becomes unnecessary upon mounting to a wiring board. Further, the wiring board 21 of the high-frequency power amplifying device 20 can be brought into less size as described above.

Owing to the sharing of the gate, the number of wires is reduced, and the occupied area of the gate electrode pad is rendered small.

Figure 11:
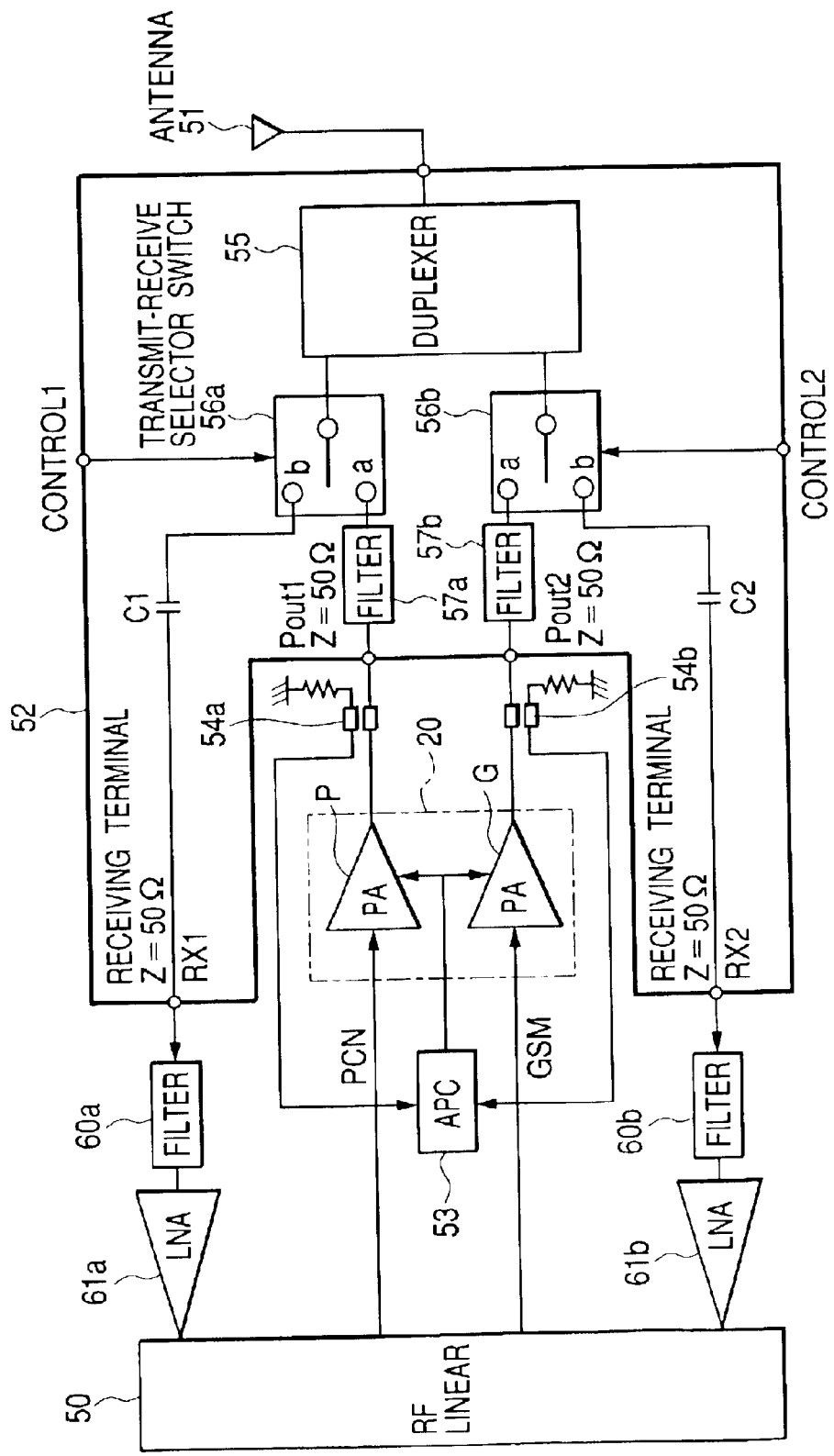
FIG. 11 is a block diagram illustrating a functional configuration of a wireless communication apparatus with the high-frequency power amplifying device according to the first embodiment.

A wireless communication apparatus having the high-frequency power amplifying device 20 according to the first embodiment built therein will next be explained. FIG. 11 is a block diagram showing part of a dual-band wireless communication apparatus and shows parts from a high-frequency signal processing IC (RF linear) 50 to an antenna (Antenna) 51. Incidentally, while an amplification system of the high-frequency power amplifying device is shown in parts in the form of two of a PCN amplification P and a GSM amplification system G, a part surrounded by a chain double-dashed line corresponds to the high-frequency power amplifying device 20. The PCN amplification system (amplifier) is designated at P and the GSM amplification system (amplifier) is designated at G.

The antenna 51 is connected to an antenna terminal of an antenna transmit/receive selector 52. The antenna transmit/receive selector 52 has output terminals Pout1 and Pout2 which input outputs of the high-frequency power amplifying device 20, receiving terminals Rx1 and Rx2, and control terminals contorol1 and contorol2.

A GSM signal sent from the high-frequency signal processing IC 50 is transmitted to a PA (P) and outputted to the Pout1. The output of the PA (P) is detected by a coupler 54a. The detected signal is fed back to an automatic power control circuit (APC circuit) 53. The APC circuit 53 is operated based on the detected signal to control the PA (P).

Similarly, the GSM signal outputted from the high-frequency signal processing IC 50 is sent to a PA(G) and outputted to the Pout2. The output of the PA (G) is detected by a coupler 54b. The detected signal is fed back to the APC circuit 53. The APC circuit 53 is operated based on the detected signal to control the PA (G).

The antenna transmit/receive selector 52 has a duplexer 55. The duplexer 55 has terminals of which one terminal is connected to the antenna terminal. One of other two terminals thereof is connected to a transmit/receive selector switch 56a fo PCN, and the other thereof is connected to a transmit/receive selector switch 56b for GSM.

A contact a of the transmit/receive selector switch 56a is connected to the Pout1 via a filter 57a. A contact b of the transmit/receive selector switch 56a is connected to a receiving terminal Rx1 via a capacitor C1. The transmit/receive selector switch 56a performs switching to an electrical connection with the contact a or b according to a control signal inputted to the control terminal contorol1.

A contact a of the transmit/receive selector switch 56b is connected to the Pout2 via a filter 57b. A contact b of the transmit/receive selector switch 56b is connected to a receiving terminal Rx2 via a capacitor C2. The transmit/receive selector switch 56b performs switching to an electrical connection with the contact a or b according to a control signal inputted to the control terminal contorol2.

A filter 60a and a low noise amplifier (LNA) 61a are sequentially connected between the receiving terminal Rx1 and the high-frequency signal processing IC 50. A filter 60b and a low noise amplifier (LNA) 61b are sequentially connected between the receiving terminal Rx2 and the high-frequency signal processing IC 50.

This wireless communication apparatus enables PCN communications and GSM communications.

Figure 12A:
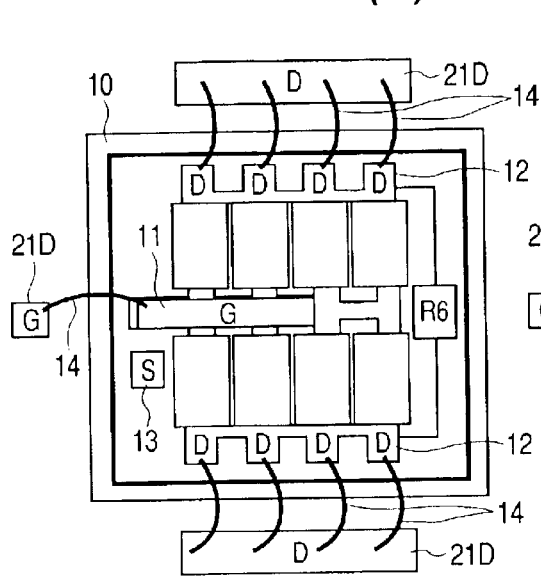
FIGS. 12(a) and 12(b) are typical plan views illustrating the differences in wire lengths due to changes in wire connecting position in a semiconductor device illustrative of a modification of the first embodiment.
Figure 12B:
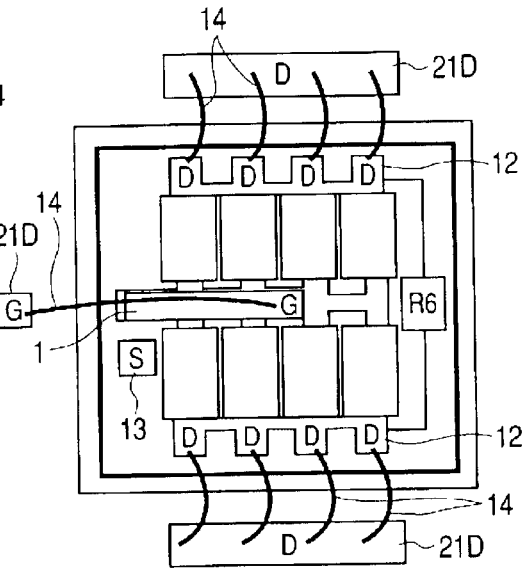

FIGS. 12(a) and 12(b) are respectively typical diagrams showing a modification of the first embodiment. In the present modification, drain electrode pads 12 are formed as a strip electrode 25 so that wires 14 can be connected at plural spots. In the first embodiment, the source electrode pad 13 is provided on the central left side of the semiconductor chip 10, whereas in the present modification, a source electrode pad 13 is caused to approach the side of the semiconductor chip 10, which is located on its other side, and gate electrode pads 11 formed as a long strip electrode 25 are disposed from its spaced portion to the center of the semiconductor chip 10.

Namely, the strip electrode 25 extends from at least a row intermediate position portion of each of gate electrode pad rows (first electrode terminal rows) respectively disposed along a pair of sides of a semiconductor substrate 30 to one end portion (left end of the semiconductor chip 10) of each row in association with each other.

Disposing the strip electrode 25 in this way makes it possible to connect a wire 14 to a desired position with respect to the gate electrode pad 11 upon wire bonding. FIG. 12(a) shows an example in which the wire 14 is fixed to the left end of the strip electrode 25. In this case, the length of the wire 14 can be rendered the shortest, and the inductance of the wire 14 can be minimized.

FIG. 12(b) is an example in which a wire 14 is connected to the right end of the strip electrode 25. An electricity feeding point can be placed in the center of the semiconductor chip 10, and electricity can be uniformly supplied owing to the whole gate electrode layer.

In other words, the formation of the gate electrode pads 11 corresponding to external electrode terminals as the strip electrode 25 allows a change in the connection position of the wire 14. Thus, the connecting position of each wire is selected according to semiconductor device manufacture variations, variations in the manufacture of microstrip lines on the wiring board 21 and variations in the manufacture of mounted chip parts to thereby allow the selection of an inductance value of each wire, thus making it possible to manufacture a high-quality high-frequency power amplifying module.

According to the first embodiment, it has the following advantageous effects.

(1) The structure is provided wherein the drain electrode pads 12 are disposed in plural form along one side of the semiconductor chip 10 with the gate electrode pad 11 interposed therebetween, and the drain electrode pads 12 are disposed in plural form along the other side of the semiconductor chip 10. Therefore, the semiconductor chip 10 can be rendered close to the square. As a result, when the semiconductor chip 10 is built in the high-frequency power amplifying device 20, the wiring board 21 of the high-frequency power amplifying device 20 can be reduced as compared with the case in which the slender semiconductor chip is incorporated therein, and the high-frequency power amplifying device 20 can be made small-sized. Owing to the size reduction in the high-frequency power amplifying device 20, the wireless communication apparatus with the high-frequency power amplifying device built therein can be also brought into less size.

(2) Since the electrode patterns of the transistors are brought into the finger pattern structure, and the length of each finger is set to less than or equal to 300 μm, the phase shift in signal becomes hard to occur and degradation in communication characteristic can be suppressed.

(3) The gate electrode pad 11 used as the strip electrode 25 is disposed in the center of the semiconductor chip 10 so as to extend from one end side of the semiconductor chip 10 to the center of the semiconductor chip 10. Therefore, the position of connection of the wire 14 to the gate electrode pad 11 can be changed, thus making it possible to adjust the inductance of the wire and make an output adjustment or the like to the high-frequency power amplifying device 20. Further, the electricity feeding point can be also set to a desired position.

(4) As compared with the example 2 mm long and 1 mm wide as shown in FIG. 20, the semiconductor chip 10 according to the first embodiment, which is shaped in the form of the square whose one side is 1.2 mm and whose another side is 1.0 mm, is rendered small-sized and also reduced in area. Therefore, a broad location and a long location become unnecessary for packaging or mounting of the high-frequency power amplifying device 20 onto the wiring board 21. It is thus possible to bring the high-frequency power amplifying device 20 into less size owing to the size reduction in the wiring board 21. The high-frequency power amplifying device 20 can be also brought into less weight.

(5) A wireless communication apparatus equipped with a small-sized and light high-frequency power amplifying device 20 can also be brought into less size and weight. In the case of the firs embodiment in particular, the number of capacitive elements can also be reduced and hence the firs embodiment is made smaller in size and weight.

(6) A size reduction in the wiring board 21 of the high-frequency power amplifying device 20, a reduction in the cost of the high-frequency power amplifying device 20 owing to a reduction in the mounted number of capacitive elements, and a reduction in the cost of the wireless communication apparatus can be also achieved.

(Second Embodiment)

Figure 13:
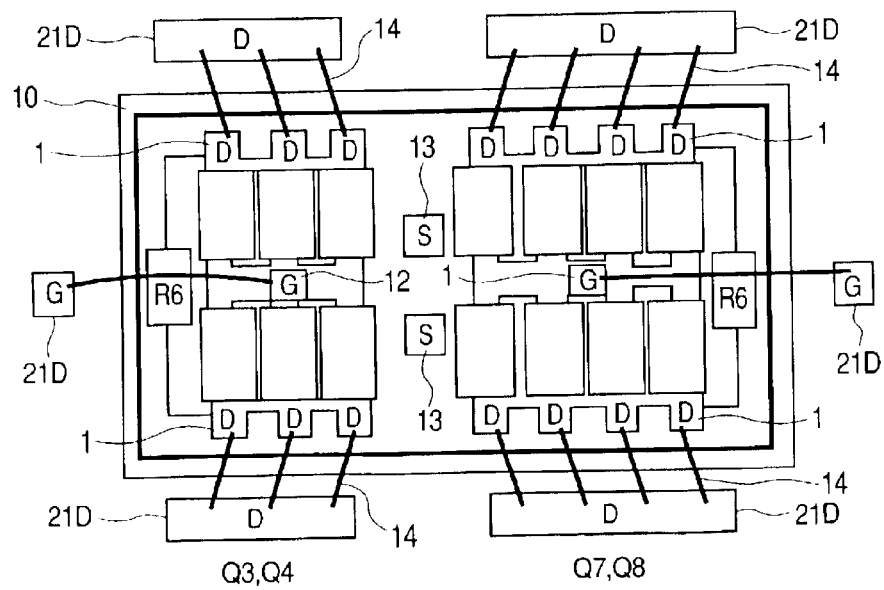
FIG. 13 is a typical plan view of a semiconductor device illustrative of another embodiment (second embodiment) of the present invention.

FIG. 13 is a typical plan view of a semiconductor device showing another embodiment (second embodiment) of the present invention. In the second embodiment, a plurality of transistors constituting final amplifying stages are built in a single semiconductor chip 10 (semiconductor substrate 30). Wires 14 for connecting gate electrode pads (control electrode terminals) 11 of the respective transistors, and wire bonding pads 21D corresponding to parts of wirings for a wiring board 21 are placed so as to extend in a direction to mutually intersect between the adjacent transistors and between the wires adjacent and close to one another.

In FIG. 13, the two transistors respectively constituting the final amplifying stages, e.g., transistors Q3 and Q4 and transistors Q7 and Q8 are monolithically formed on the semiconductor substrate 30. The wires 14 located on the downside of the transistors Q3 and Q4, and the wires 14 located on the downside of the transistors Q7 and Q8 extend in a direction in which they intersect. The wires 14 located on the upside of the transistors Q3 and Q4 and the wires 14 located on the upside of the transistors Q7 and Q8 extend in a direction in which they intersect. An angle of intersection thereof is set to more than or equal to 30°.

This means that when one amplification system is in operation, the other amplification system is not operated. However, this is to prevent the event that when two wires are closed to each other between transistors different in amplification system as viewed in the same direction and in a parallel direction, a current induced by mutual induction is developed in each of wires for transistors in the non-operated amplification system so that noise is produced due to the current, thus causing trouble in the operated amplification system.

A wireless communication apparatus having built therein the high-frequency power amplifying device 20 with the semiconductor chip 10 according to the first embodiment built therein enables a phone call with low noise.

(Third Embodiment)

Figure 14A:
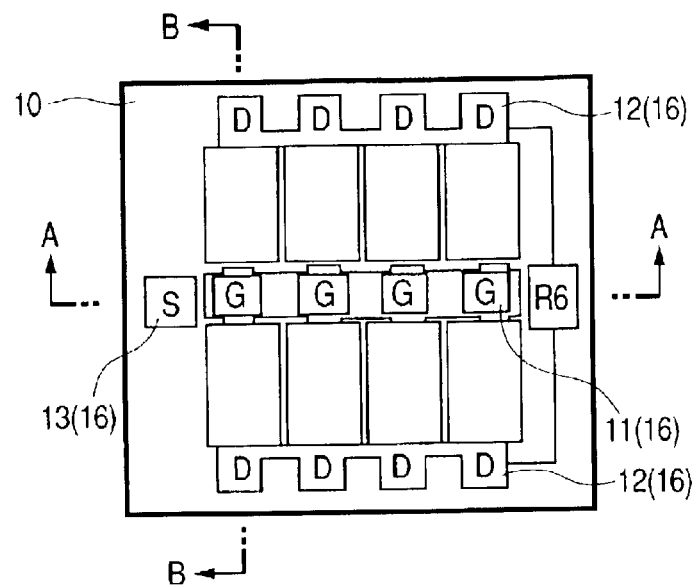
FIGS. 14(a) to 14(c) are typical diagrams showing a semiconductor device illustrative of a further embodiment (third embodiment) of the present invention.
Figure 14B:
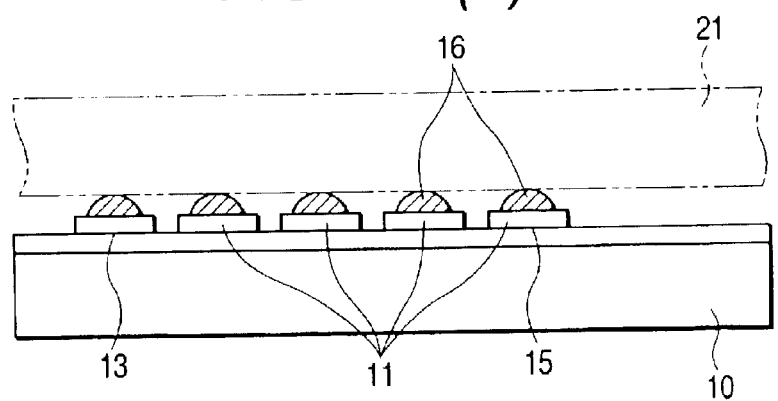
Figure 14C:
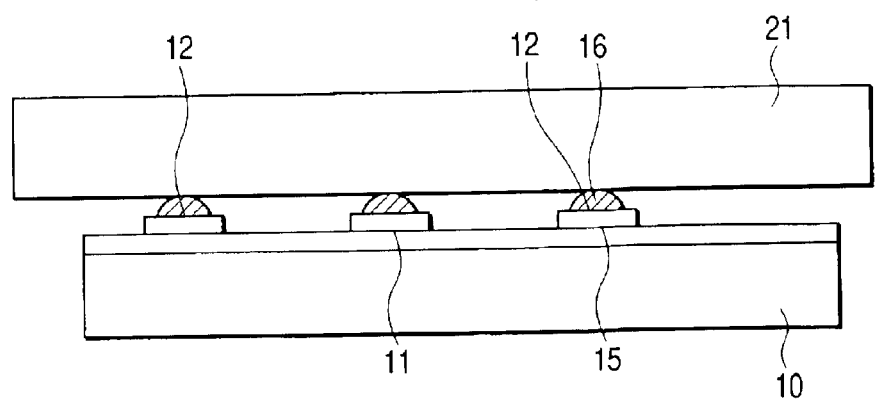

FIGS. 14(a) to 14(c) are typical diagrams of a semiconductor device using external electrode terminals as protruded electrodes, showing a further embodiment (third embodiment) of the present invention. FIG. 14(a) is a plan view of the semiconductor device. FIG. 14(b) is a cross-sectional view taken along line A—A of FIG. 14(a), and FIG. 14(c) is a cross-sectional view taken along line B—B of FIG. 14(a), respectively. Incidentally, a wiring board 21 for fixing the semiconductor chip 10 is indicated by a chain double-dashed line in FIGS. 14(b) and 14(c).

Protruded electrodes (bump electrodes) 16 are respectively provided on base or underlying electrodes (bump pads) 15. In the drawings, the wiring board 21 is shown in a state of being in contact with the protruded electrodes (bump electrodes) 16.

By providing the external electrode terminals of the semiconductor chip 10 as the protruded electrodes, inductance can be reduced as compared with the wire-based connections. Thus, the high-frequency power amplifying device 20 is capable of reducing a loss in each wire on the drain side and improving its characteristics. For instance, the efficiency of the high-frequency power amplifying device 20 results in a 1 to 2% increase and the output thereof results in an approximately 0.1 dBD of improvement.

Figure 15A:
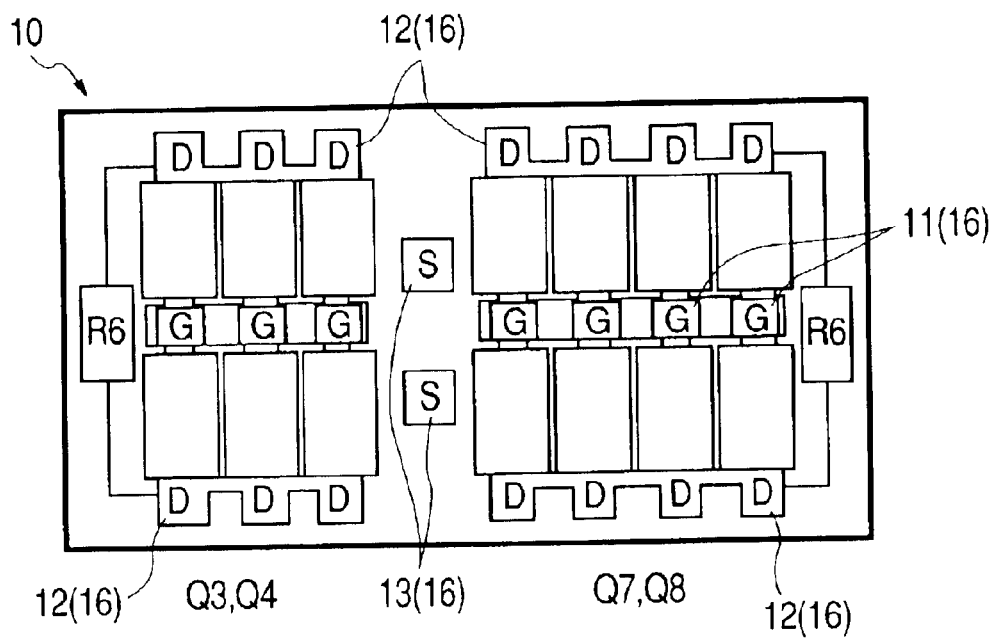
FIGS. 15(a)b and 15(b) are plan views of a semiconductor device showing a modification of the third embodiment.
Figure 15B:
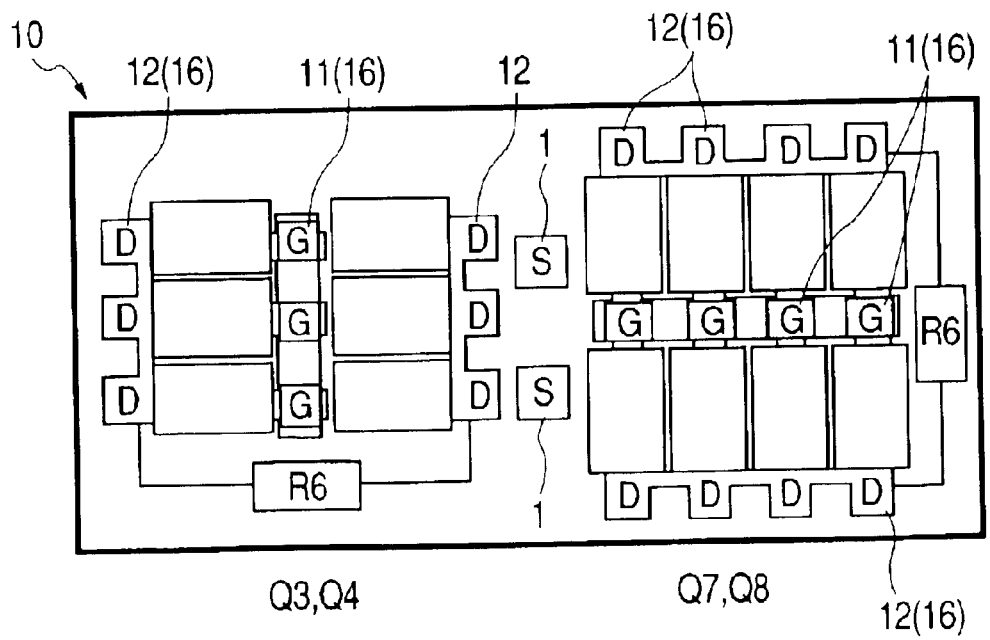
Figure 16:
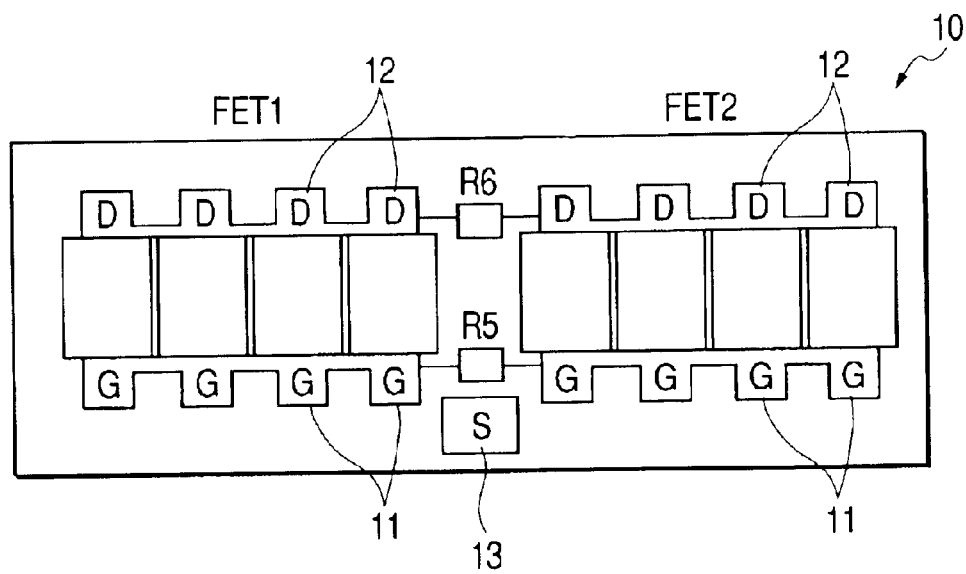
FIG. 16 is a typical plan view of a semiconductor device with transistors built therein constituting a final amplifier stage in a high-frequency power amplifying device discussed in advance of the present invention.

FIGS. 15(a) and 15(b) are plan views of a semiconductor device showing a modification of the third embodiment. FIG. 15(a) is one wherein in the semiconductor chip 10 shown in FIG. 13, external electrode terminals are provided as protruded electrodes (bump electrodes) 16. Namely, respective electrodes of two transistors constituting final amplifying stages, e.g., transistors Q3 and Q4 and transistors Q7 and Q8 are provided on a main surface of a semiconductor chip 10 so as to serve as the protruded electrodes (bump electrodes) 16.

FIG. 15(b) shows a layout configuration in which the transistors Q3 and Q4 are turned 90° in FIG. 15(a). This brings about an advantageous effect in that the generation of a current induced due to mutual induction exerted from the transistors Q7 and Q8 to the transistors Q3 and Q4 when the transistors Q3 and Q4 are not operated and the transistors Q7 and Q8 are in operation, is reduced and noise of a wireless communication apparatus with the high-frequency power amplifying device 20 built therein is reduced.

While the invention made above by the present inventors has been described specifically based on the illustrated embodiments, the present invention is not limited to the embodiments. It is needless to say that various changes can be made thereto without the scope not departing from the substance thereof. Namely, while the present embodiment has described the example in which MOSFETs are used as the transistors, e.g., the example in which MOSFETs are used as the semiconductor amplifying elements (transistors), other transistors may be adopted. As the transistors, may be mentioned, for example, a GaAs-MES (Metal-Semiconductor) FET, an HEMT (High Electron Mobility Transistor), an Si—GeFET, etc. They can be applied in a manner similar to the above-described embodiments, and similar advantageous effects can be obtained.

While the dual-band type has been described in the above embodiments, the invention can be similarly applied to a multi-mode communication system and a multi-band multi-mode communication system, and similar advantageous effects can be obtained.

Advantageous effects obtained by typical ones of the inventions disclosed in the present application will be described in brief as follows:

(1) A small-sized semiconductor device with amplifying stages built therein can be provided wherein a difference in length-to-width dimension is small.

(2) A size reduction in high-frequency power amplifying device can be achieved.

(3) A size reduction in wireless communication apparatus can be achieved.

What is claimed is:

1. A semiconductor device, comprising:
a semiconductor chip having a first region and a second region as considered in plan view;
a plurality of first transistors each having a first gate electrode layer, a first source electrode layer, and a first drain electrode layer formed in said first region;
a plurality of second transistors each having a second gate electrode layer, a second source electrode layer, and a second drain electrode layer formed in said second region;
a gate electrode pad electrically connected to said first and second gate electrode layers, formed in a gate electrode pad forming region over said semiconductor chip;
a first drain electrode pad electrically connected to said first drain electrode layers, formed in a first electrode pad forming region in said first region; and
a second drain electrode pad electrically connected to said second drain electrode layers, formed in a second electrode pad forming region in said second region;
wherein said gate electrode pad forming region is located between said first and second regions of said semiconductor chip;
said first gate electrode layers and first drain electrode layers extend in an area between said gate electrode pad forming region and first drain electrode forming region; and
said second gate electrode layers and second drain electrode layers extend in an area between said gate electrode pad forming region and second drain electrode forming region.

2. The semiconductor device according to claim 1, wherein
said first gate electrode layers, first drain electrode layers, and first source electrode layers extend in a first direction which is from said gate electrode pad forming region to said first drain electrode pad forming region; and
said second gate electrode layers, second drain electrode layers, and second source electrode layers extend in a second direction which is from said gate electrode pad forming region to said second drain electrode pad forming region.

3. The semiconductor device according to claim 2, wherein
each of said first and second gate electrode layers, first and second source electrode layers, and first and second drain electrode layers is less than or equal to 300 $\mu$m in length.

4. The semiconductor device according to claim 2, wherein
said first gate electrode layers, first drain electrode layers, and first source electrode layers are provided so that said first gate electrode layer of each transistor is located between said first drain electrode layer and first source electrode layer of that transistor;
said second gate electrode layers, second drain electrode layers, and second source electrode layers are provided so that said second gate electrode layer of each transistor is located between said second drain electrode layer and second source electrode layer of that transistor;
said first transistors are disposed one after another along a third direction transverse to said first direction; and
said second transistors are disposed one after another along a fourth direction transverse to said second direction.

5. The semiconductor device according to claim 4, wherein
said third direction is perpendicular to said first direction; and
said fourth direction is perpendicular to said second direction.

6. The semiconductor device according to claim 1, wherein
said first source electrode layers are electrically connected;
said second source electrode layers are electrically connected; and
said first and second source electrode layers are electrically connected to a source electrode formed on a back surface said semiconductor chip.

7. The semiconductor device according to claim 1, wherein
a plurality of said first drain electrode pads are formed in said first drain electrode pad forming region; and
a plurality of said second drain electrode pads are formed in said second drain electrode pad forming region.

8. The semiconductor device according to claim 2, wherein
conductive wires are connectable to said first and second drain electrode pad and said first and second drain electrode pads.

* * * * *

UNITED STATES PATENT AND TRADEMARK OFFICE
CERTIFICATE OF CORRECTION

PATENT NO. : 6,765,268 B2
APPLICATION NO. : 10/291834
DATED : July 20, 2004
INVENTOR(S) : Hitoshi Akamine et al.

It is certified that error appears in the above-identified patent and that said Letters Patent is hereby corrected as shown below:

Column 17, line 51, insert --drain-- as follows:

first drain electrode layers, formed in a first drain electrode

Column 17, line 55, insert --drain-- as follows:

second drain electrode pad forming region in said second

Column 17, line 62, insert --said-- and "pad" as follows:

pad forming region and said first drain electrode pad forming

Column 17, line 66, insert --said-- as follows:

electrode pad forming region and said second drain elec-

Column 17, line 67, insert --pad-- as follows:

trode pad forming region.

Signed and Sealed this

Fifth Day of December, 2006

JON W. DUDAS
*Director of the United States Patent and Trademark Office*